(12) United States Patent
Miura et al.

(10) Patent No.: US 9,508,465 B2
(45) Date of Patent: Nov. 29, 2016

(54) REINFORCED WIRING UNIT AND SEALING STRUCTURE

(75) Inventors: Kazunori Miura, Shizuoka (JP); Takatoshi Suzuki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 124 days.

(21) Appl. No.: 13/879,726

(22) PCT Filed: Oct. 14, 2011

(86) PCT No.: PCT/JP2011/073732
§ 371 (c)(1),
(2), (4) Date: Apr. 16, 2013

(87) PCT Pub. No.: WO2012/053454
PCT Pub. Date: Apr. 26, 2012

(65) Prior Publication Data
US 2013/0206445 A1    Aug. 15, 2013

(30) Foreign Application Priority Data
Oct. 19, 2010 (JP) .................... 2010-234801

(51) Int. Cl.
*H05K 1/02* (2006.01)
*H01B 7/04* (2006.01)
(Continued)

(52) U.S. Cl.
CPC ............ *H01B 7/04* (2013.01); *H01R 12/77* (2013.01); *H01R 13/5205* (2013.01); *H05K 1/02* (2013.01); *H05K 2201/2009* (2013.01); *H05K 2203/1147* (2013.01)

(58) Field of Classification Search
CPC ........ H01R 12/77; H01R 13/52; H01B 7/00; H01B 7/04; H05K 7/00; H05K 7/10

USPC ........................................ 174/50.64
See application file for complete search history.

(56) References Cited

U.S. PATENT DOCUMENTS 6,176,734 B1 * 1/2001 Juntwait ............. H01R 23/661
439/493
6,595,405 B2 * 7/2003 Terunuma et al. ...... 228/180.21
(Continued)

FOREIGN PATENT DOCUMENTS

| CN | 101683014 A | 3/2010 |
|---|---|---|
| JP | 4-183212 A | 6/1992 |

(Continued)

OTHER PUBLICATIONS

Korean Office Action for the related Korean Patent Application No. 10-2013-7009974 dated Aug. 24, 2014.
(Continued)

*Primary Examiner* — Courtney Smith
*Assistant Examiner* — Jessey R Ervin
(74) *Attorney, Agent, or Firm* — Kenealy & Vaidya LLP (57) ABSTRACT

Sealing performance between a sealing member and a reinforcing plate adhered to a wiring unit is prevent from being deteriorated. An FPC 1 is integrated with a sealing member 2, and a cover 3 is attached to a front end portion. On upper and lower surfaces of the FPC 1, reinforcing plates 12 each having a shape of a rectangular flat plate are arranged and adhered in an opposing manner interposing the FPC 1. The sealing member 2 is formed of elastic material such as rubber, and is fixedly attached to the FPC 1 such that the sealing member 2 covers the reinforcing plates 12 adhered to the upper and lower surfaces of the FPC 1 together with the FPC 1 located along front edges and rear edges of the reinforcing plates 12.

16 Claims, 9 Drawing Sheets

(51) Int. Cl.
*H01R 12/77* (2011.01)
*H01R 13/52* (2006.01)

(56) References Cited

U.S. PATENT DOCUMENTS

| | | | |
|---|---|---|---|
| 8,236,405 B2 * | 8/2012 | Ren | H05K 5/069 174/50 |
| 2010/0181089 A1 | 7/2010 | Hayashi et al. | |

FOREIGN PATENT DOCUMENTS

| JP | 6-5327 | A | | 1/1994 |
|---|---|---|---|---|
| JP | 6-7166 | U | | 1/1994 |
| JP | 6-68931 | A | | 3/1994 |
| JP | 6-203910 | A | | 7/1994 |
| JP | 8-22870 | A | | 1/1996 |
| JP | 2001-155815 | A | | 6/2001 |
| JP | 2002-42956 | A | | 2/2002 |
| JP | 2002-170627 | A | | 6/2002 |
| JP | 2005-93269 | A | | 4/2005 |
| JP | 2008-171596 | A | | 7/2008 |
| JP | 2008171596 | A | * | 7/2008 |
| JP | 2008-227471 | A | | 9/2008 |
| JP | 2010-16123 | A | | 1/2010 |
| JP | 2010016123 | A | * | 1/2010 |
| JP | 2010-34170 | A | | 2/2010 |
| JP | 2010-113862 | A | | 5/2010 |

OTHER PUBLICATIONS

Korean Office Action for the related Korean Patent Application No. 10-2013-7009974 dated Feb. 28, 2014.
International Search Report and Written Opinion of the International Search Report for PCT/JP2011/073732 dated Nov. 22, 2011.
Japanese Office Action for the related Japanese Patent Application No. 2010-234801 dated Aug. 19, 2014.
Korean Office Action for the related Korean Patent Application No. 10-2013-7009974 dated Mar. 20, 2015.
Japanese Office Action for the related Japanese Patent Application No. 2010-234801 dated Dec. 9, 2014.
Chinese Office Action for the related Chinese Patent Application No. 201180050676.6 dated Nov. 21, 2014.
Korean Office Action for the related Korean Patent Application No. 10-2013-7009974 dated Feb. 12, 2015.
Chinese Office Action for the related Chinese Patent Application No. 201180050676.6 dated Aug. 5, 2015.
Japanese Office Action for the related Japanese Patent Application No. 2010-234801 dated Sep. 29, 2015.
Chinese Office Action (3rd) for the related Chinese Patent Application No. 201180050676.6 dated Dec. 16, 2015.

* cited by examiner

REINFORCED WIRING UNIT AND SEALING STRUCTURE

TECHNICAL FIELD

The present invention relates to a wiring unit and a sealing structure.

BACKGROUND ART

As shown in Patent Document 1 indicated below, on some wiring units, such as an FPC (flexible printed circuit board) and an FFC (flexible flat cable), a sealing member is integrated to seal the space between the wiring unit and a drawing outlet, such as a cavity of a connector housing, for the wiring unit.

With this kind of wiring unit, the sealing performance of the sealing member may be deteriorated due to twisting or bending of the wiring unit. Therefore, as shown in Patent Document 2, it has been considered to fixedly attach reinforcing plates to the two main surfaces of an FPC, and to form a fitting portion by providing a sealing member to cover the two reinforcing plates.

PRIOR ART DOCUMENT

Patent Document

Patent Document 1: JP 2001-155815 A
Patent Document 2: JP 2010-034170 A

SUMMARY OF INVENTION

Problem to be Solved by Invention

In the conventional wiring unit described above, at the time of, for example, moving the fitting portion in or out of a through hole of a housing of an electronic device, if the FPC moves relative to the housing, or the reinforcing plate hits the housing, a force to remove the reinforcing plate from the FPC may act, and the sealing performance between the reinforcing plates and the sealing member may be deteriorated.

The present invention is made in view of this problem, and an object of the present invention is to prevent the sealing performance between a reinforcing plate and a sealing member from being deteriorated.

Means for Solving the Problem

The above object of the present invention is achieved by the following configuration.
(1) A wiring unit including a reinforcing plate adhered to a surface, and a sealing member covering the entire surface of the reinforcing plate.
(2) The wiring unit having the configuration of (1) described above, wherein the reinforcing plate has a corrugated surface.
(3). A sealing structure including a wiring unit, a reinforcing plate adhered to a surface of the wiring unit, a sealing member covering the entire surface of the reinforcing plate and fixedly attached to the wiring unit, and a housing having a cavity into which the wiring unit is inserted, the cavity being sealed by the sealing member.

According to the wiring unit having the configuration of the above (1), the reinforcing plate interposed between the sealing member and the wiring unit has its entire surface covered by the sealing member, and is embedded between the sealing member and the wiring unit. Therefore, the sealing performance between the reinforcing plate and the sealing member can be prevented from being deteriorated by the removal of the reinforcing plate from the wiring unit.

BRIEF DESCRIPTION OF DRAWINGS

FIGS. 1A and 1B illustrate an FPC of one embodiment of the present invention, in which FIG. 1A is a perspective view seen from front, and FIG. 1B is a partial exploded perspective view seen from back.

FIGS. 2A and 2B illustrate the FPC to which to which reinforcing plates are attached, in which FIG. 2A is a perspective view seen from front, and FIG. 2B is an A-A arrow sectional view of FIG. 2A.

FIGS. 3A and 3B illustrate the FPC to which a sealing member is fixed, in which FIG. 3A is a perspective view seen from front, and FIG. 3B is a top view.

FIGS. 5A and 5B illustrate steps of connecting the FPC to a connector housing, in which FIG. 5A illustrates a condition before the FPC is inserted to a drawing outlet, and FIG. 5B illustrates a condition after the insertion, each being a perspective view seen from front.

FIGS. 6A and 6B are front views illustrating a state in which the FPC is connected to the connector housing, in which FIG. 6A illustrates a case in which the reinforcing plates are not provided, and FIG. 6B illustrates a case in which the reinforcing plates are provided.

FIGS. 7A and 7B illustrate a variation of the FPC and the reinforcing plates, in which FIG. 7A is a perspective view seen from front, and FIG. 7B is a D-D arrow sectional view of FIG. 7A.

EMBODIMENTS OF INVENTION

Figure 1A:
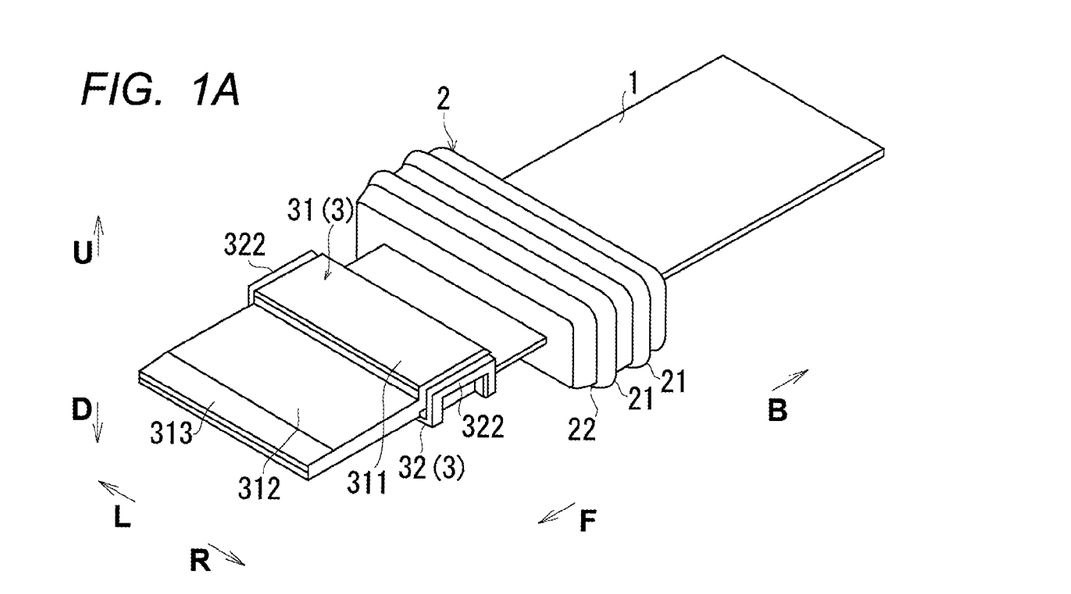
Figure 1B:
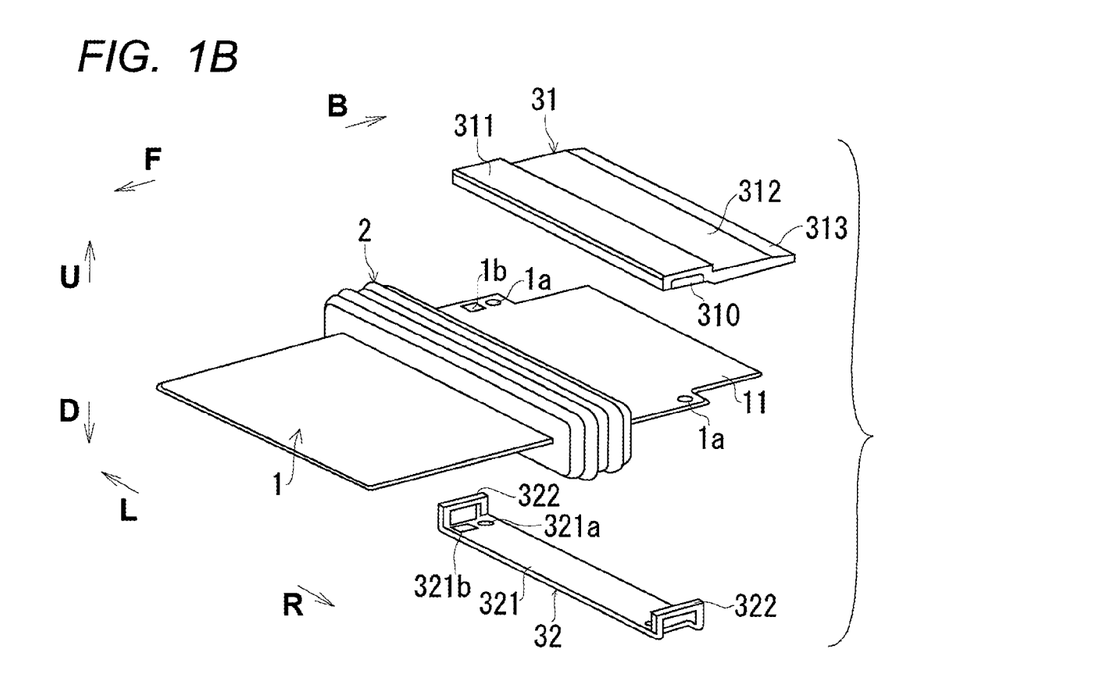
Figure 2A:
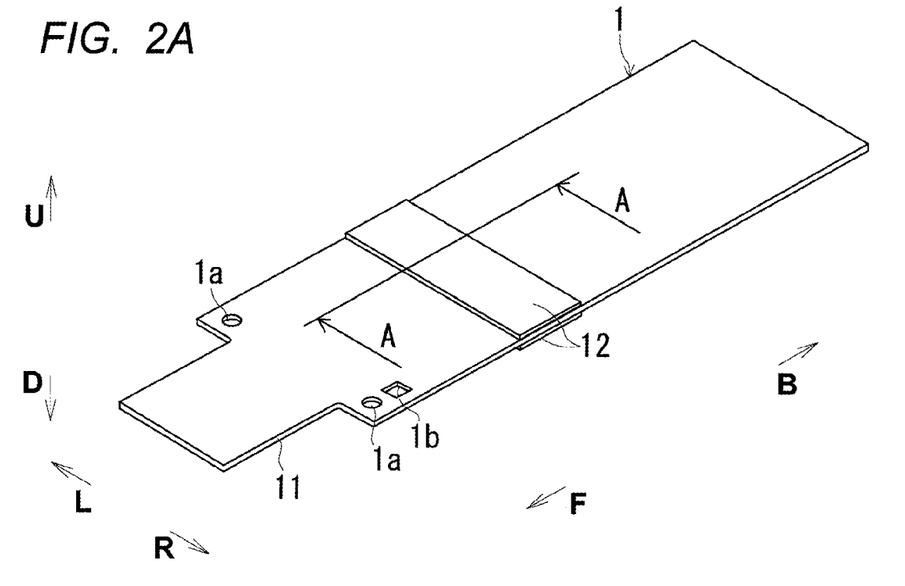
Figure 2B:
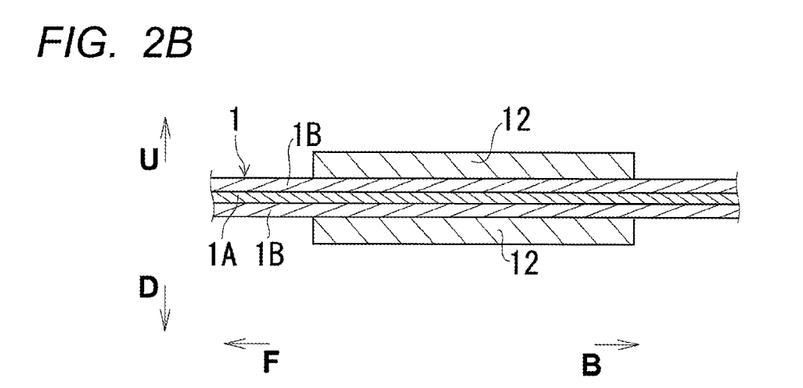
Figure 3A:
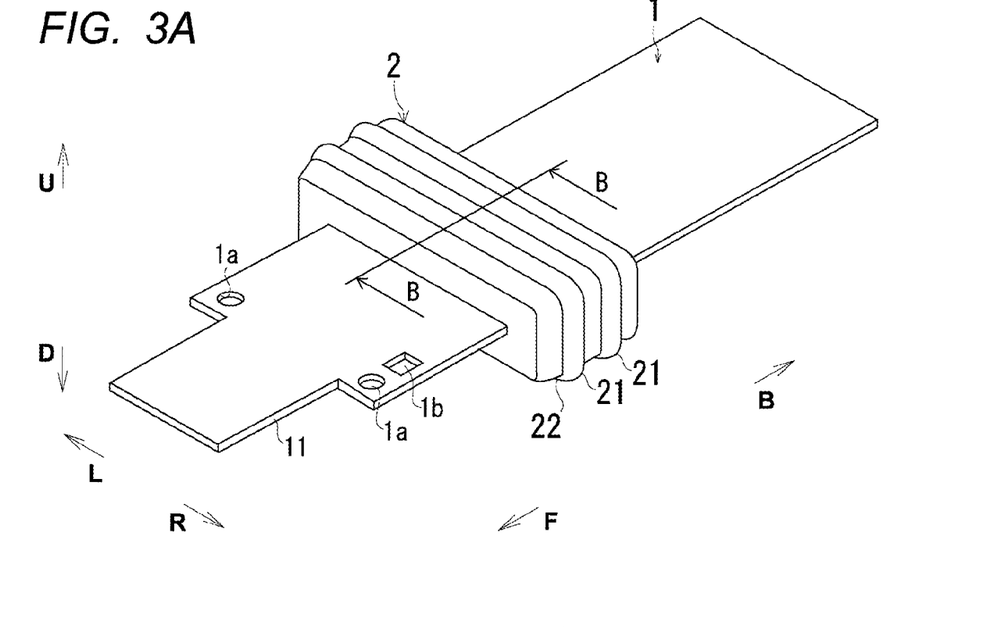
Figure 3B:
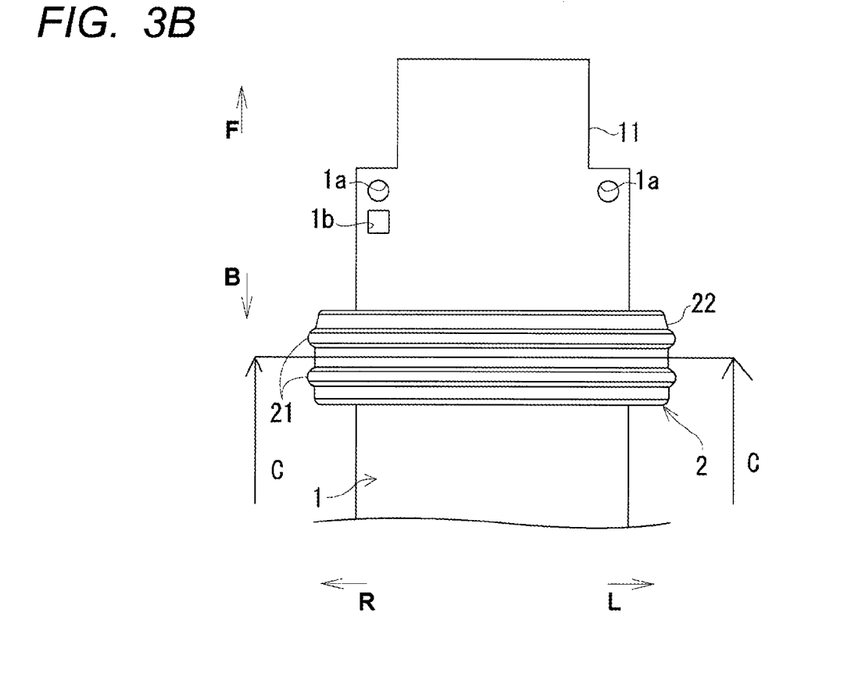

Hereinafter, embodiments of the invention will be described with reference to the drawings. FIGS. 1A and 1B illustrate a FPC 1 of the present embodiment. FIGS. 2A and 2B illustrate a state in which reinforcing plates 12 are attached to the FPC 1. FIGS. 3A and 3B illustrate a state in which a sealing member 2 is fixed to the FPC 1. In the drawings, an arrow F shows a forward direction of the FPC 1, an arrow B shows a backward direction, an arrow L shows a left direction, an arrow R shows a right direction, an arrow U shows an upward direction, and an arrow D shows a downward direction.

The FPC (flexible printed circuit board) 1 shown in FIG. 1 is a wiring unit (e.g, a flexible flat circuit body including a plurality of conductors, and an insulating cover collectively covering the plurality of conductors that are arranged parallel to each other) adapted to be installed into a cavity, such as a connector housing, and connected to a terminal in the cavity. The FPC 1 is integrated with the sealing member 2, and a cover 3 is installed to the front end portion of the FPC 1.

As shown in FIG. 2A, the FPC 1 is constructed by covering the upper and lower sides of a base film 1A, in which a wiring is formed, with cover films 1B. A width reduced portion 11 whose width is narrowed compared with the back end side of the FPC 1 is provided at the front end portion of the FPC 1. A connecting portion for connecting a circuit which is constructed by the base film 1A to the outside is provided on the lower surface of the width reduced portion 11.

The reinforcing plates 12 which have a rectangular flat shape are pasted with adhesives or the like to the upper and lower surfaces of the FPC 1 which are located behind the width reduced portion 11. Both the reinforcing plates 12 have a width in the right-to-left direction which is equal to that of the FPC 1, and as shown in FIG. 2B, are arranged to be opposed to hold the FPC 1. As shown in the exemplary embodiments of FIGS. 2A, 2B, 4A, 4B, 6B, 7A, 7B and 8, the reinforcing plates 12 can have a rectangular parallelepiped shape or boundary.

Through holes 1a, 1b for attaching the cover 3 to the FPC 1 are provided at right and left ends of the FPC 1 which are located behind the width reduced portion 11.

The sealing member 2 is formed of elastic materials, such as rubber, and as shown in FIGS. 3A and 3B, has such a shape that two protrusions (convex strips) 21 are provided perpendicular to the forward/backward direction around the outer peripheral surfaces of a square block body. A taper portion 22 is provided at the front end portion of the sealing member 2 which is located forward further than the front protrusion 21.

Figure 4A:
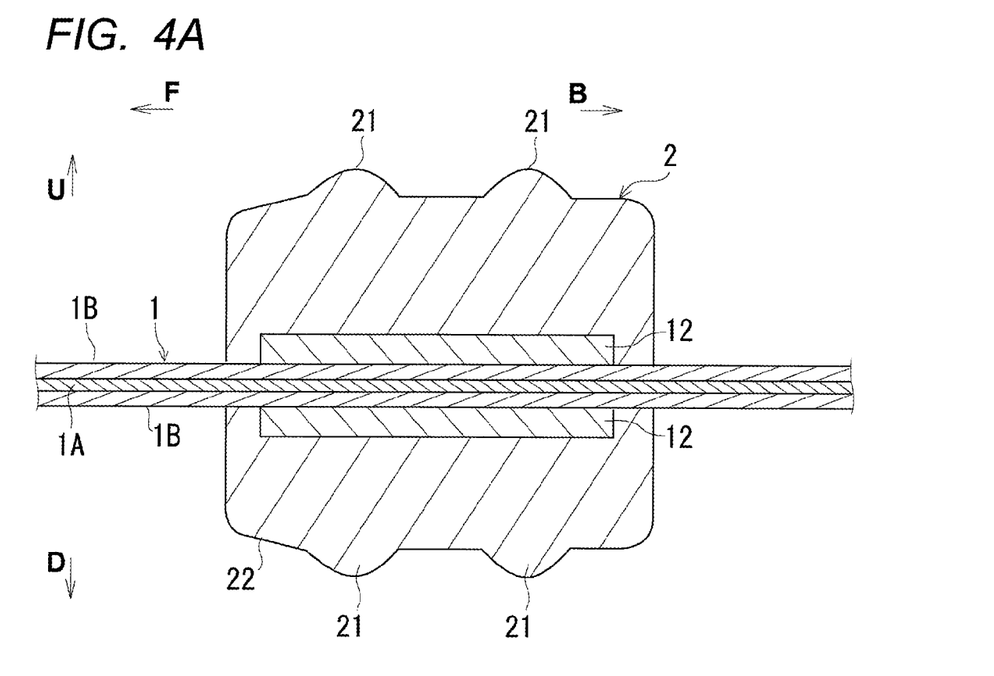
FIG. 4A is a B-B arrow sectional view of FIG. 3A.
Figure 4B:
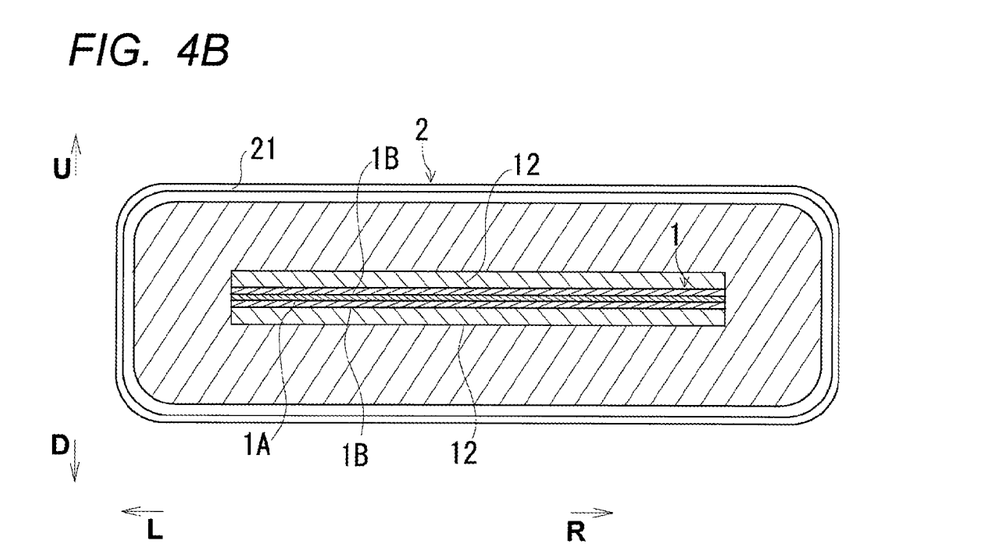
FIG. 4B is a C-C arrow sectional view of FIG. 3B.

As shown in FIGS. 4A and 4B with sections, the sealing member 2 is fixed to the FPC 1 so that the reinforcing plates 12, which are pasted to the upper and lower surfaces of the FPC 1, and the portion of the FPC 1 which is located along the front edges and back edges of the reinforcing plates 12 are commonly covered. For this reason, the entire surfaces of the reinforcing plates 12 are covered by the sealing member 2, and the reinforcing plates 12 becomes embedded between the sealing member 2 and the FPC 1.

As shown in FIG. 1B, the cover 3 is fixed to the FPC 1 by attaching a fixing member 32 from below the FPC 1 to a main body 31 which covers the upper side of the width reduced portion 11. The fixing member 32 is fixed to the main body 31 when fitting portions 321a, 321b are fitted into the through holes 1a, 1b of the FPC 1 and locking portions 322 are locked with protrusions 310 of a fixing portion 311. A flat plate portion 312 of the main body 31 includes a slope portion 313, which is gradually inclined downward to the front end side, on the upper surface of the front end portion, and includes an accommodating portion (not shown in the drawings), which accommodates the width reduced portion 11, on the lower surface.

Next, an operation of installing the FPC 1 into a cavity 40 of a connector housing (housing) 4 is described.

Figure 5A:
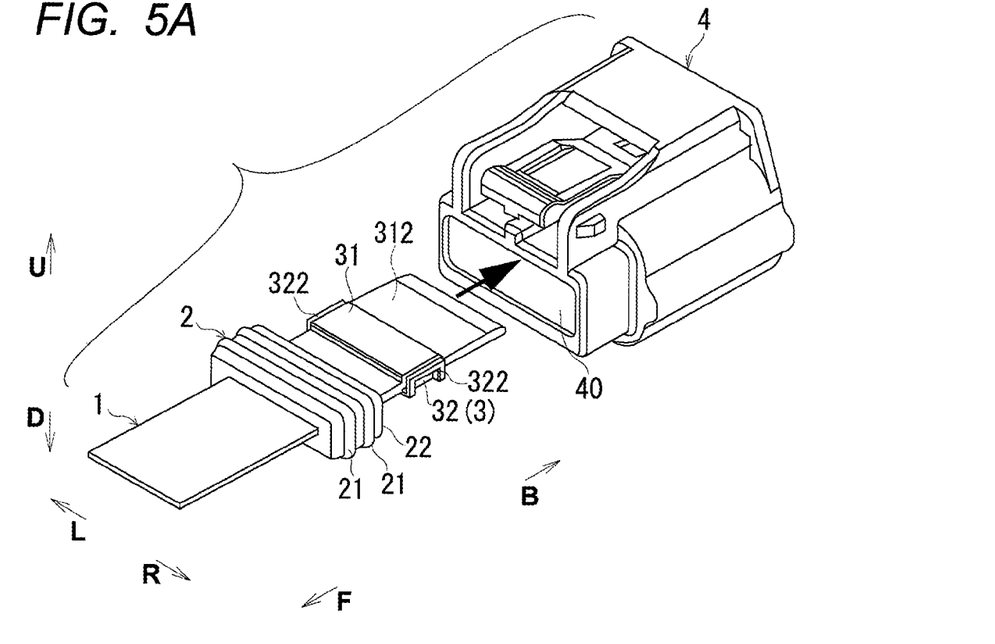

As shown with a bold arrow in FIG. 5A, the FPC 1 is installed into the cavity 40 by inserting the cover 3 into the cavity 40 from the side of the flat plate portion 312 which the main body 31 includes. When the FPC 1 is installed into the cavity 40, the above-described connecting portion which is exposed from the accommodating portion of the flat plate portion 312 is connected to a terminal in the cavity 40.

Figure 5B:
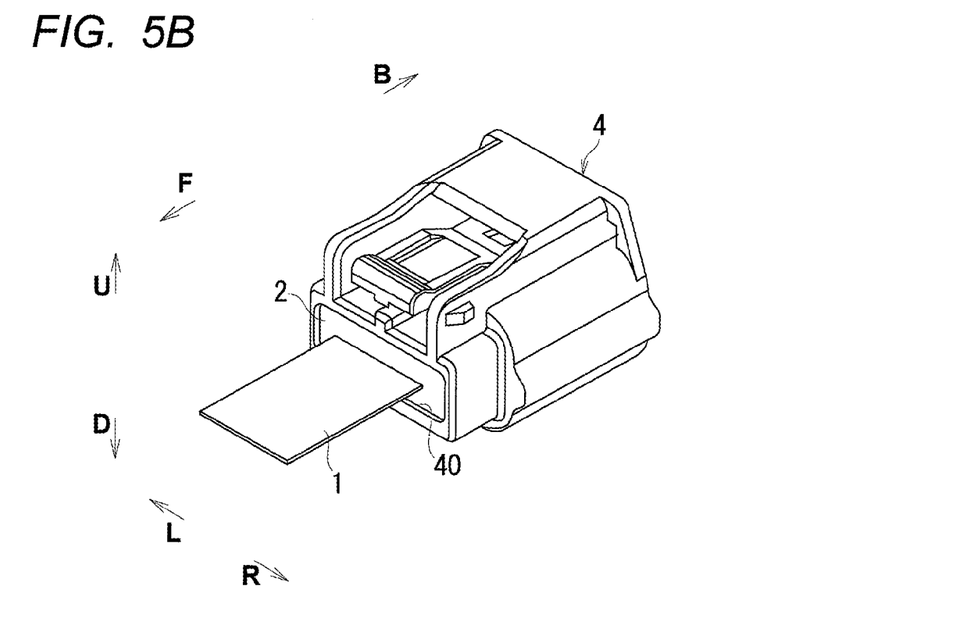

The sealing member 2, which is integrated with the FPC 1, closes the front end opening portion of the cavity 40, as shown in FIG. 5B, and seals the space between the cavity 40 and the FPC 1 since the outer peripheral surfaces provided with the protrusions 21 are pressure-connected with the internal surfaces of the cavity 40.

Figure 6A:
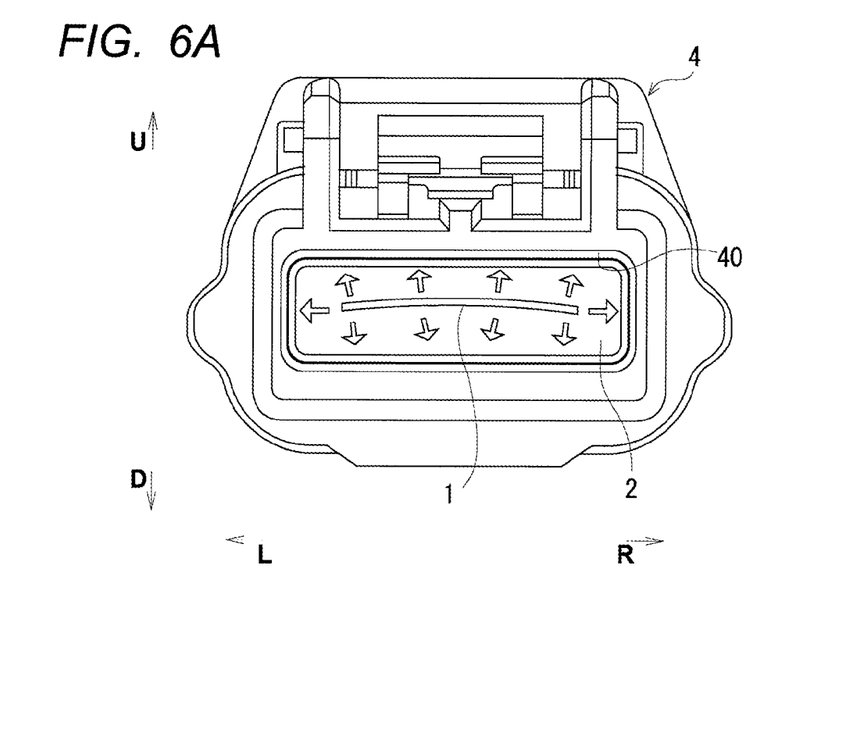

For example, as shown in FIG. 6A, when the FPC 1 is installed into the cavity 40 in a bent state that the central portion in the width direction is located above the right and left edge portions or in a twisted state that the left edge portion is located above the right edge portion, the sealing member 2 is deformed together with the FPC 1, and there is a possibility that there may be places where the sealing pressure of the sealing member 2 is deteriorated. Further, when the FPC 1 which was installed into the cavity 40, is bent so that the central portion in the width direction is located above the right and left edge portions, or is twisted so that the left edge portion is located above the right edge portion, the sealing member 2 is deformed together with the FPC 1, and there is a possibility that there may be places where the sealing pressure of the sealing member 2 is deteriorated.

Figure 6B:
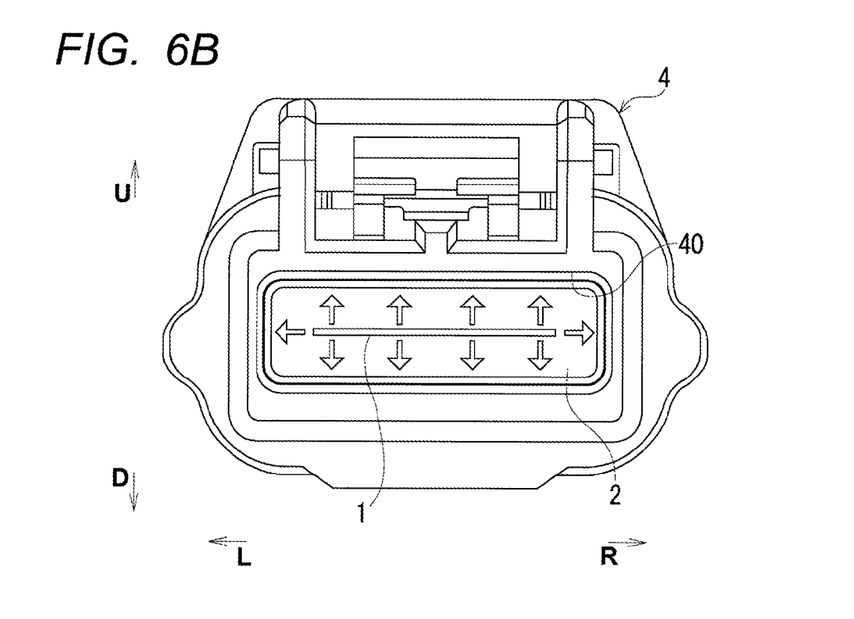

However, in the FPC 1 of the embodiment in which the reinforcing plates 12 are embedded between the sealing member 2 and the FPC 1, as shown in FIG. 6B, the bending and the twisting of the FPC 1 in the location where the sealing member 2 is provided are prevented with the reinforcing plates 12. Therefore, the sealing pressure of the sealing member 2 is prevented from decreasing when the FPC 1 is deformed with the sealing member 2 and installed into the cavity 40, or the FPC 1 which was installed into the cavity 40 is deformed with the sealing member 2.

If a portion of the reinforcing plates 12 is exposed outside from the sealing member 2, when the sealing member 2 moves into/from the cavity 40 or the FPC 1 moves relative to the cavity 40, a force that makes the reinforcing plates 12 remove from the FPC 1 acts. However, in the FPC 1 of the embodiment, because the entire surfaces are covered by the sealing member 2 and the reinforcing plates 12 are embedded between the sealing member 2 and the FPC 1, a force to remove the reinforcing plates 12 from the FPC 1 due to the deformation of the sealing member 2, the abutment of the reinforcing plate 12 or the like is prevented from acting on the reinforcing plates 12.

According to this embodiment, since the reinforcing plates 12 which are interposed between the sealing member 2 and the FPC 1 are embedded between the sealing member 2 and the FPC 1, the reinforcing plates 12 can be prevented from contacting with outside parts to be removed from the FPC 1. Therefore, it can be prevented to remove the reinforcing plates 12 from the FPC 1 to deteriorate the sealing performance between the reinforcing plates 12 and the sealing member 2.

Figure 9A:
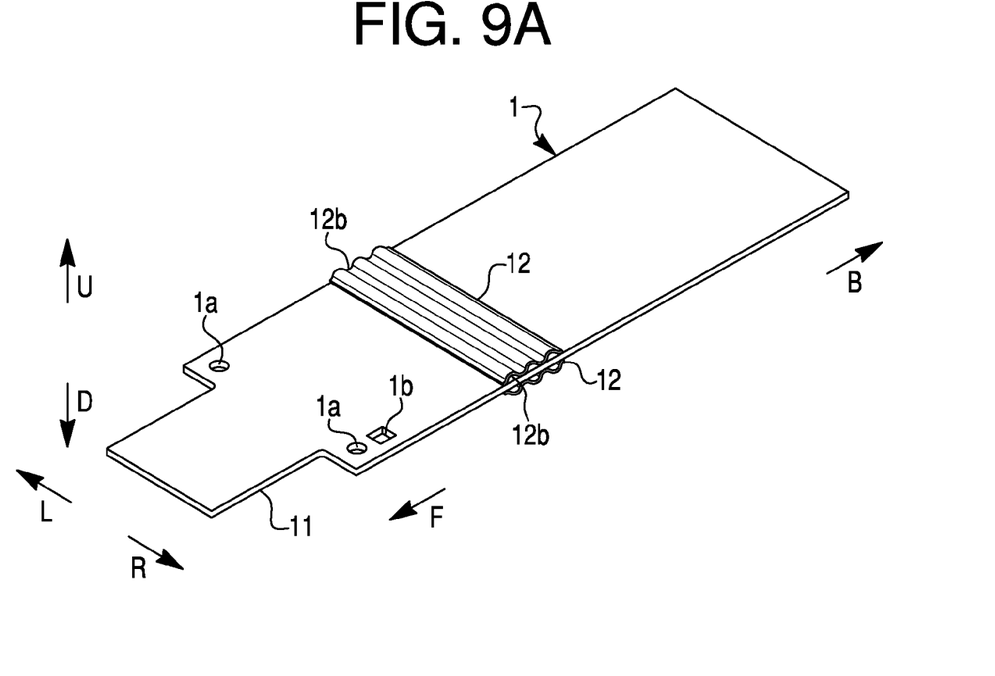
FIG. 9A is a front perspective view of an FPC to which an alternate embodiment of a reinforcing plate is attached.
Figure 9B:
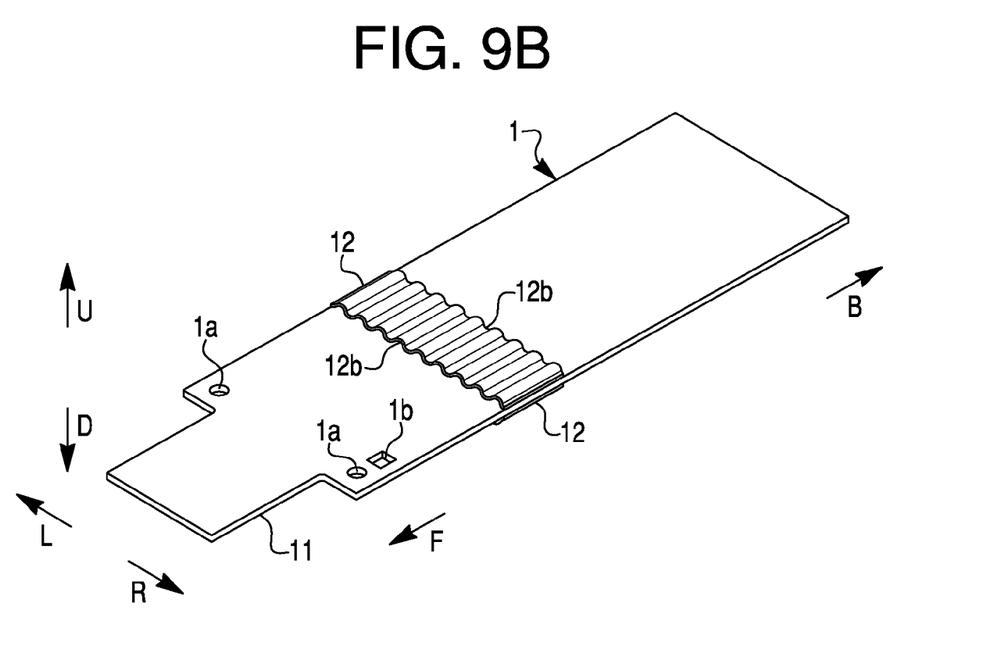
FIG. 9B is a front perspective view of an FPC to which another alternate embodiment of a reinforcing plate is attached.

While the reinforcing plates 12 are provided on both the upper and the lower surfaces the FPC 1 in the embodiment described above, the reinforcing plate 12 may be provided only on one of the upper and lower surfaces. The shapes of the reinforcing plate 12 and the sealing member 2 may also be changed in accordance with the shape of the wiring unit drawing outlet, such as the cavity 40, into or from which the FPC 1 is moved. For example, the surface 12b of the reinforcing plate 12 may be corrugated, as shown in FIGS. 9A and 9B.

While the embodiment described above has been described in connection with the case in which that the present invention is applied to the FPC 1 as a wiring unit, the wiring unit may also be an FFC (flexible flat cable). The configuration of the cover 3 is also optional, and is not limited to the configuration of the embodiment described above. A configuration which is not provided with the cover 3 is also possible.

Figure 7A:
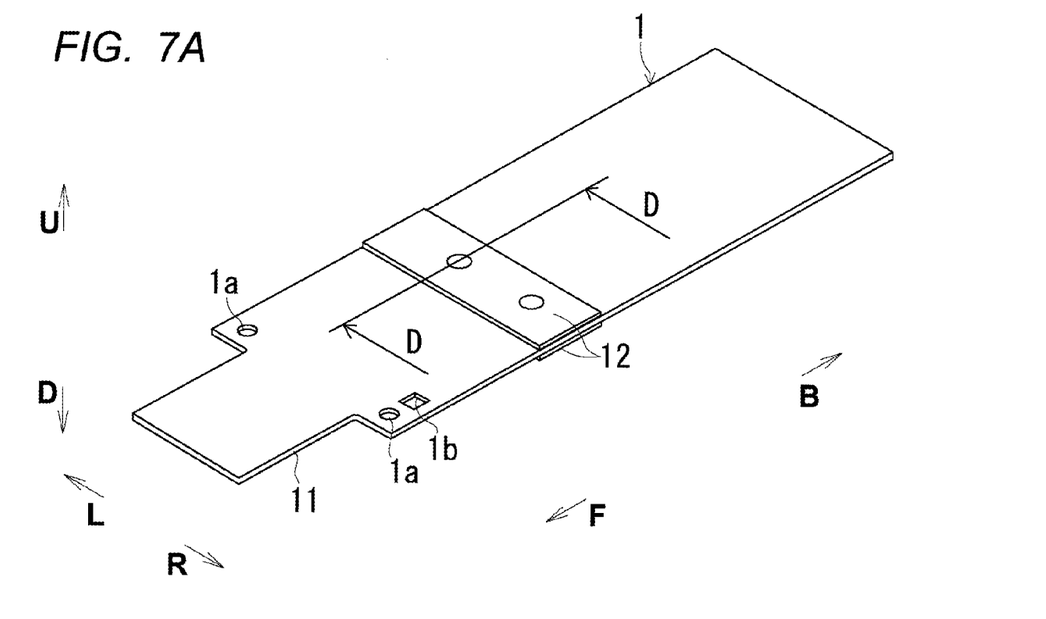
Figure 7B:
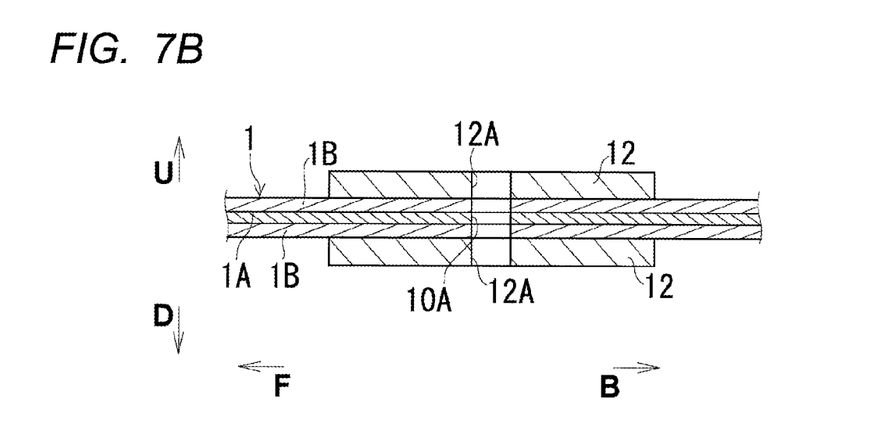
Figure 8:
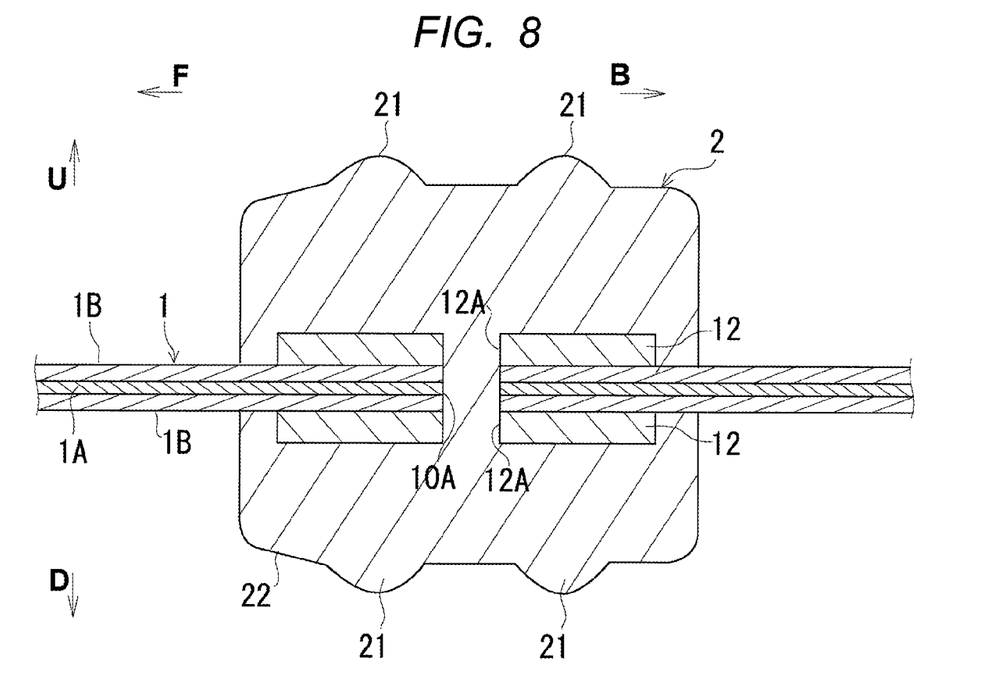
FIG. 8 illustrates a state in which the sealing member is fixed to the FPC, in a section of FIG. 7B.

As shown in FIG. 7, through holes which penetrate the FPC 1 and the reinforcing plates 12 may be provided, and the sealing member 2 may be integrally molded with the FPC 1 and the reinforcing plates 12. The through holes are constructed by through holes 10A provided by the FPC 1 and through holes 12A provided by the reinforcing plates 12. As shown in FIG. 8, if the sealing member 2 is fixed to the FPC 1 by being integrally molded, the sealing member 2 is filled into the through holes 10A and the through holes 12A, and the portion of the sealing member 2 at the upper surface side of the FPC 1 and the portion of the sealing member 2 at the lower surface side of the FPC 1 are linked through the through holes.

According to this configuration, by integrally molding the sealing member 2 with the FPC 1 and the reinforcing plates 12, the adhesion of the sealing member 2 to the FPC 1 and the reinforcing plates 12 becomes high, and sealing performance can be improved. Since the portion of the sealing member 2 at the upper surface side of the FPC 1 and the portion of the sealing member 2 at the lower surface side of the FPC 1 are linked through the through holes, the shearing force of the sealing member 2 to the FPC 1 and the reinforcing plates 12 can be prevented from increasing, and the sealing member 2 can be prevented from being removed from the FPC 1 and the reinforcing plates 12. By changing the size, shape, and number of the through holes formed in the FPC 1 and the reinforcing plates 12, the holding force to fix the sealing member 2 to the FPC 1 and the reinforcing plates 12 can be adjusted in accordance with the requirement specification for every component.

The foregoing embodiments are merely representative embodiments of the invention, and the invention is not limited to these embodiments. That is, various modifications can be made without departing from the framework of the invention. This application is based on the Japanese Patent Application No. 2010-234801 filed on Oct. 19, 2010, the content of which is incorporated herein by reference.

INDUSTRIAL APPLICABILITY

According to the wiring unit and the sealing structure of the present invention, when a fitting portion is moved into/from a through hole of a housing of electronic devices, a force to remove the reinforcing plates from the FPC due to the deformation of the sealing member, the abutment of the reinforcing plates or the like is prevented from acting on the reinforcing plates, and the sealing performance between the reinforcing plates and the sealing member can be prevented from being deteriorated.

LIST OF REFERENCE SIGNS

1 FPC (wiring unit)
2 sealing member
3 cover
1A base film
1B cover film
10A through holes
12A through holes
11 width reduced portion
12 reinforcing plate
1a, 1b through hole
21 protrusion
22 taper portion
31 main body
310 protrusion
311 fixing portion
312 flat plate portion
32 fixing member
321a, 321b fitting portion
322 locking portion 4 connector housing (housing)
40 cavity

The invention claimed is:
1. A sealing structure comprising:
a wiring unit formed with a through hole and having a unit length and a unit width, and the unit width is less than the unit length;
a reinforcing plate filling an outer boundary shaped as a rectangular parallelepiped, adhered to a surface of the wiring unit, and formed with a through hole communicated with the through hole of the wiring unit, the reinforcing plate having a plate length that is substantially equal to the unit width, and the reinforcing plate having a plate width that is less than the plate length;
a sealing member covering the entire outer boundary of the reinforcing plate and fixedly attached to the wiring unit, the sealing member having a sealing length that is greater than the plate length, and the sealing member having a sealing width that is greater than the plate width and that is less than the unit length, such that the reinforcing plate is embedded between the sealing member and the wiring unit; and
a housing having a cavity into which the wiring unit is inserted, the cavity being sealed by the sealing member, wherein the through hole of the wiring unit and the through hole of the reinforcing plate are filled with the sealing member.

2. The wiring unit according to claim 1, wherein the reinforcing plate has a corrugated surface.

3. The wiring unit according to claim 2, wherein the reinforcing plate is adhered to one side of the surface, and further including another reinforcing plate disposed at an opposite side of the surface.

4. The wiring unit according to claim 3, wherein the other reinforcing plate fills a second outer boundary, and the sealing member covers the entire surface of the other reinforcing plate.

5. The wiring unit according to claim 2, wherein the surface covered by the reinforcing plate is flat.

6. The wiring unit according to claim 2, wherein the sealing member includes multiple convex strips.

7. The sealing structure according to claim 1, wherein the reinforcing plate is adhered to one side of the surface, and further including another reinforcing plate disposed at an opposite side of the surface.

8. The sealing structure according to claim 7, wherein the sealing member covers the entire second outer boundary of the other reinforcing plate.

9. The sealing structure according to claim 1, wherein the surface covered by the reinforcing plate is flat.

10. The sealing structure according to claim 1, wherein the surface is elongated, and a longitudinal length of the surface that is covered by the reinforcing plate is shorter than a lateral length of the surface that is covered by the reinforcing plate.

11. The sealing structure according to claim 1, wherein the sealing member includes multiple convex strips.

12. The wiring unit according to claim 2,
wherein the sealing member has a portion at the upper surface side of the wiring unit, and
the sealing member has a portion at the lower surface side of the wiring unit in communication with the portion at the upper surface side through the through holes.

13. The wiring unit according to claim 12, wherein the sealing member encloses the entire outer boundary of the reinforcing plate and a part of the wiring unit adjacent to the reinforcing plate and are integrally formed therewith, while filing the through holes.

14. The seal structure according to claim 1,
wherein the sealing member has a portion at the upper surface side of the wiring unit, and
the sealing member has a portion at the lower surface side of the wiring unit in communication with the portion at the upper surface side through the through holes.

15. The seal structure according to claim 14, wherein the sealing member encloses the entire outer boundary of the reinforcing plate and a part of the wiring unit adjacent to the reinforcing plate and are integrally formed therewith, while filing the through holes.

16. The sealing structure according to claim 1, wherein
the wire unit is flat and includes a conductor and an insulating cover covering the conductor; and
the reinforcing plate is adhered to a surface of the insulating cover.

* * * * *